(12) United States Patent
Ando

(10) Patent No.: US 6,383,869 B1
(45) Date of Patent: May 7, 2002

(54) SIDE WALL CONTACT STRUCTURE AND METHOD OF FORMING THE SAME

(75) Inventor: Masateru Ando, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/939,605

(22) Filed: Aug. 28, 2001

Related U.S. Application Data

(63) Continuation of application No. 09/313,983, filed on May 19, 1999.

(30) Foreign Application Priority Data

May 19, 1998 (JP) .......................................... 10-136717

(51) Int. Cl.⁷ .......................................... H01L 21/8242
(52) U.S. Cl. ........................ 438/254; 438/253; 438/396; 438/397; 257/306; 257/311
(58) Field of Search ................................ 438/253, 254, 438/238–240, 396, 397; 257/306, 311, 758

(56) References Cited

U.S. PATENT DOCUMENTS

| | | | |
|---|---|---|---|
| 5,081,060 A | 1/1992 | Kim | 438/586 |
| 5,409,855 A | 4/1995 | Jun | 438/396 |
| 5,691,229 A | * 11/1997 | Okamura et al. | 438/253 |

FOREIGN PATENT DOCUMENTS

| | | | |
|---|---|---|---|
| JP | H2-133924 | 5/1990 | .......... H01L/21/302 |
| JP | H3-3324 | 1/1991 | ............ H01L/21/28 |
| JP | H4-109626 | 4/1992 | ....... H01L/21/3205 |
| JP | H8-222713 | 8/1996 | .......... H01L/27/108 |
| JP | H9-199681 | 7/1997 | .......... H01L/27/108 |

* cited by examiner

Primary Examiner—Charles Bowers
Assistant Examiner—Hsien-Ming Lee
(74) Attorney, Agent, or Firm—Sughrue Mion, PLLC

(57) ABSTRACT

A method of forming a side wall contact on a side wall of a contact hole in an inter-layer insulator structure by an etch-back process The method includes forming a first insulation film on a top insulation layer of the inter-layer insulator structure, forming a second insulation film to extend on the side wall and a bottom of the contact hole as well as on a surface of the first insulation film. The first insulation film has a higher etching selectivity than the top insulation layer of the inter-layer insulator structure and the second insulation film has a lower etching selectivity than the top insulation layer of the inter-layer insulator structure. The second insulation film is lower in etching selectivity than the first insulation film. An etch back process is carried out on the second insulation film by use of the first insulation film as an etching stopper so as to remove a bottom portion of the second insulation film on the bottom of the contact hole, to form a side wall contact on the side wall of the contact hole.

4 Claims, 11 Drawing Sheets

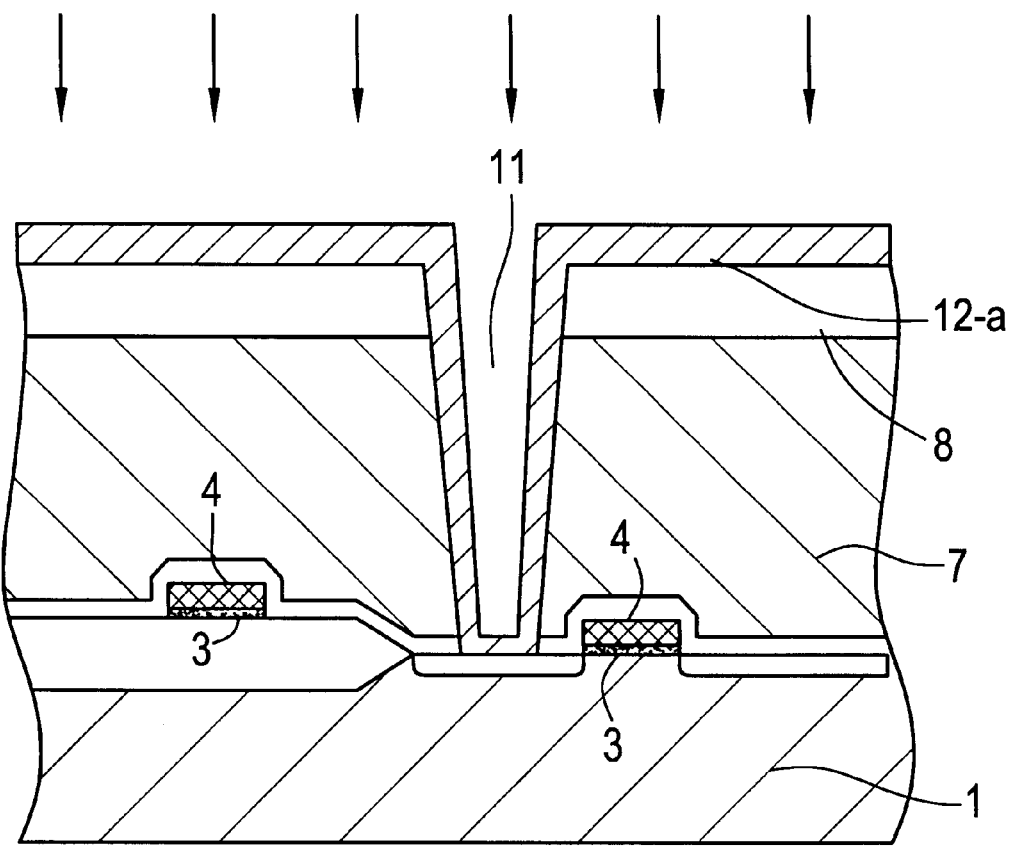

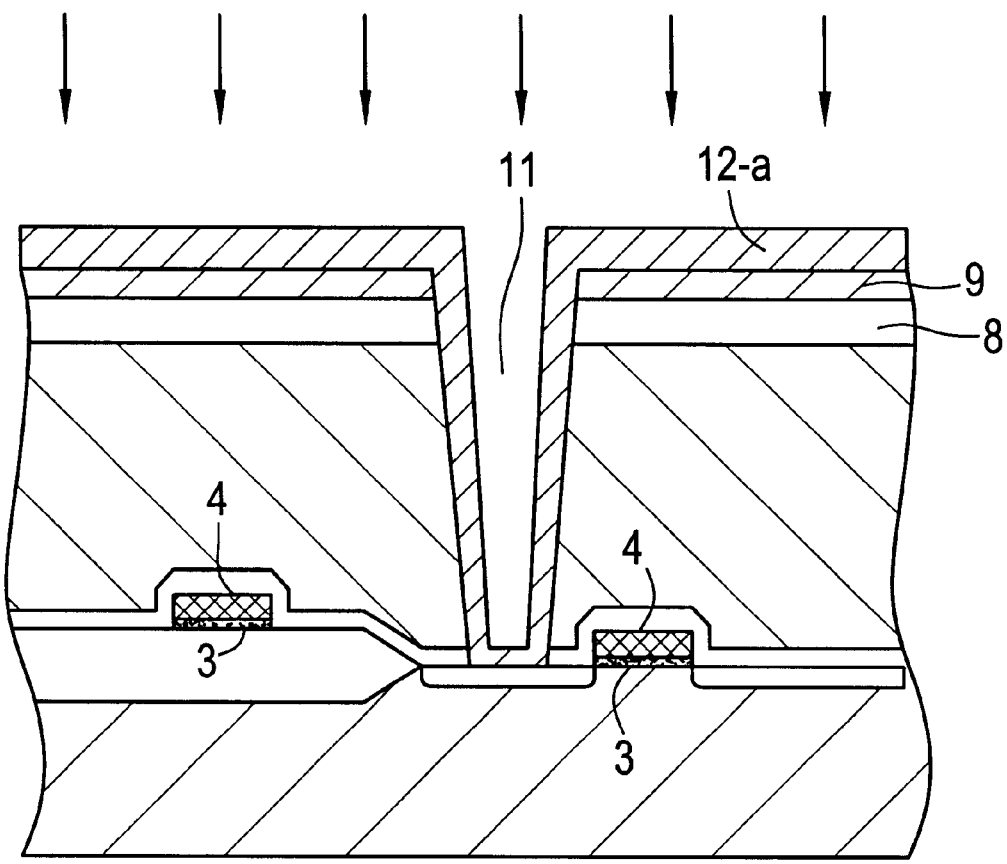

SIDE WALL CONTACT STRUCTURE AND METHOD OF FORMING THE SAME

This is a continuation of application Ser. No. 09/313,983 filed May 19, 1999, the disclosure of which is herein incorporated by reference.

BACKGROUND OF THE INVENTION

The present invention relates to a semiconductor device, and more particularly to a side wall contact on a side wall of a contact hole formed in an inter-layer insulator over a semiconductor substrate as well as a method of forming the same.

As the degree of the integration of large scale integrated circuits has been on the increase, each device as integrated has been scaled down. In these circumstances, it is important how a margin between devices is secured without deterioration of a high yield. For example, a self-align-contact or a side wall contact are typical techniques for securing the same.

The side wall contact technique is applicable to various semiconductor devices such as a dynamic random access memory. A conventional method of forming a memory cell structure of the dynamic random access memory will be described. FIGS. 1A through 1E are fragmentary cross sectional elevation views illustrative of a conventional method of forming a conventional memory cell structure of a dynamic random access memory, wherein said conventional memory cell structure has a conventional side wall contact structure.

With reference to FIG. 1A, field oxide films 2 are selectively formed on a passive region of a p-type silicon substrate 1 to define an active region. Gate oxide films 3 are formed on a part of the field oxide film 2 and the active region of the silicon substrate 1. First and second gate electrodes 4 of a polysilicon film which also act as word lines are formed on the gate oxide film 3. The gate electrode 4 is positioned over a channel region in the active region of the substrate 1. Source and drain diffusion regions 5 of n⁻-type are selectively formed by self-alignment on the active regions other than the channel region of the substrate 1, whereby the source and drain diffusion regions 5 define the channel region. A first inter-layer insulator 6 is entirely formed which extends over the passive regions and the active regions of the substrate 1 so that the first inter-layer insulator 6 covers the field oxide film 2, the gate electrodes 4 and the source and drain diffusion regions 5.

With reference to FIG. 1B, a second inter-layer insulator made of boro-phospho silicate glass from tetraethyl orthosilicate (TEOS) is formed on the first inter-layer insulator 6. The second inter-layer insulator is much thicker than the first inter-layer insulator 6. Although illustration is omitted, bit contacts and bit lines are formed. The bit contacts provide electrical connections between the bit lines and the source and drain regions. The bit contacts and the bit lines are formed by well known techniques of photo-lithography and subsequent dry etching. The bit lines may be made of a second polysilicon. A third inter-layer insulator made of boro-phospho silicate glass from tetraethyl orthosilicate (TEOS) is formed on the second inter-layer insulator and over the bit lines, whereby an inter-layer insulator 7 of the second and third inter-layer insulators is then formed. A fourth inter-layer insulator 8 is formed on the inter-layer insulator 7. The fourth inter-layer insulator 8 may be made of a different insulating material, such as silicon dioxide, from the second and third inter-layer insulators. The fourth inter-layer insulator 8 is much thinner than the inter-layer insulator 7. The thickness of the fourth inter-layer insulator 8 is, for example, in the range of about 150–200 nanometers. A photo-resist is applied on the fourth inter-layer insulator 8 and then subjected to exposure and subsequent development to form a photo-resist pattern 10 over the fourth inter-layer insulator 8.

With reference to FIG. 1C, a dry etching process is carried out by use of the photo-resist pattern 10 to selectively etch laminations of the fourth inter-layer insulator 8, the inter-layer insulator 7 and the and the first inter-layer insulator 6, whereby a contact hole 11 is formed which penetrates the laminations of the fourth inter-layer insulator 8, the inter-layer insulator 7 and the first inter-layer insulator 6, so that a part of the diffusion region 5 is shown through the contact hole 11. The contact hole 11 has a depth of about 1200 nanometers. An oxide film 12-a made of non-doped silicate glass (NSG) from TEOS is entirely deposited so that the oxide film 12-a extends on a bottom and a side wall of the contact hole as well as on the surface of the fourth inter-layer insulator 8.

With reference to FIG. 1D, an etch back to the oxide film 12-a is carried out by use of a dry etching process for the purpose of removing the bottom part of the oxide film 12-a on the diffusion region 5 and also the top parts of the oxide film 12-a on the fourth inter-layer insulator 8. It is necessary to completely remove the bottom part of the oxide film 12-a so that no residual part of the oxide film 12-a remains on the bottom of the contact hole 11, whereby the part of the diffusion region 5 is shown through the contact hole If a diameter of the top portion of the contact hole 11 is about 0.3 micrometers, then an aspect ratio of the contact hole 11 is about 4. This high aspect ratio of the contact hole causes a micro-loading effect which reduces an etching rate of the oxide film 12-a in the deep region of the contact hole 11. Namely, the micro-loading effect causes the oxide film 12-a over the contact hole 11 to be higher in etching rate than in the deep region of the contact hole 11. This means that, in order to exactly etch the bottom portion of the oxide film 12-a, it is necessary to allow an over-etching to the upper portion of the oxide film 12-a over the contact hole 11 since the upper portion of the oxide film 12-a is higher in etching rate than the deep portion of the oxide film 12-a.

This over-etching to the upper portion of the oxide film 12-a means that not only the top portion of the oxide film 12-a on the surface of the fourth inter-layer insulator 8 but also a shallow portion of the oxide film 12-a positioned in a shallow region of the contact hole 11 are etched, whereby the fourth inter-layer insulator 8 reduces in thickness and thus is made thin, and further the top portion of the oxide film 12-a drops in level so that the top level of the etched oxide film 12-a becomes lower than the bottom level of the fourth inter-layer insulator 8.

Namely, in order to exactly etch the bottom portion of the oxide film 12-a, the over-etching is continued until the shallower portion of the oxide film 12-a in the shallower region of the contact hole 11 is etched, whereby the oxide film 12-a is made into a side wall contact 12-b which extends on the side wall of the contact hole 11 except on a shallower region of the contact hole 11. The top portion of the side wall contact 12-b lies lower in level than the bottom of the fourth inter-layer insulator 8, whereby an upper region of the inter-layer insulator 7 is shown between the top portion of the side wall contact 12-b and the bottom of the fourth inter-layer insulator 8.

This is caused by the micro-loading effect in the etch-back process under the condition of the high aspect ratio of the contact hole. As the aspect ratio of the contact hole is large, then the micro-loading effect is remarkable, whereby the necessary over-etching amount for completely removing the bottom portion of the oxide film 12-a from the bottom of the contact hole 11 is increased, thereby increasing the amount of drop in level of the top of the side wall contact 11 or the shown region of the inter-layer insulator 7.

A storage electrode 13 made of polysilicon is then formed which fills the contact hole 11 and extends over the contact hole 11 and the fourth inter-layer insulator 8. As the requirement for scaling down the storage capacitor increases, it is possible that an alignment of the storage electrode 13 to the contact hole will deteriorate so that a part of the top portion of the contact hole 11 is shown without complete coverage of the top portion of the contact hole 11 by the storage electrode 13.

As the next process, a wet etching with a hydrofluoric acid etchant in a hemi-spherical grain(HSG) technique is carried out to increase the roughness of the surface of the storage electrode 13, thereby increasing the surface area of the storage electrode 13 for increasing the capacitance without increasing the occupied area of the storage capacitor. This wet etching process may also cause the shown part of the inter-layer insulator 7 to be etched with the etchant, whereby an etched hollow portion 14 is formed in the shown part of the inter-layer insulator 7 between the edge of the fourth inter-layer insulator 8 and the top of the side wall contact 12-b.

With reference to FIG. 1E, a capacitive dielectric film 15 is formed on the surface of the storage electrode 13. A plate electrode 16 is then formed on the capacitive dielectric film 15 so that the capacitive dielectric film 15 is sandwiched by the storage electrode 13 and the plate electrode 16. However, the etched hollow portion 14 may remarkably deteriorate the coverage of the capacitive dielectric film 15 and the plate electrode 16. This deterioration in coverage of the capacitive dielectric film 15 and the plate electrode 16 may increase the leakage of current through the capacitive dielectric film 15.

In order to settle the above problem caused by the etched hollow portion, it is proposed to increase the thickness of the fourth inter-layer insulator 8, for example, about 300–350 nanometers, so that the bottom level of the fourth inter-layer insulator 8 will lie below the top of the side wall contact 12-b to form an overlapped margin between the top portion of the side wall contact 12-b and the fourth inter-layer insulator 8, whereby no shown part is formed of the inter-layer insulator 7. This increase in thickness of the fourth inter-layer insulator 8, however, causes the other problem, in that there is an increase in the aspect ratio when the contact hole is formed. This high aspect ratio exacerbates the micro-loading effect.

In the above circumstances, it is necessary to develop a novel method of forming a side wall contact on a side wall of a contact hole with a high aspect ratio free from the above problems.

SUMMARY OF THE INVENTION

Accordingly, it is an object of the present invention to provide a novel method of forming a side wall contact on a side wall of a contact hole with a high aspect ratio free from the above problems.

It is a further object of the present invention to provide a novel method of forming a side wall contact on a side wall of a contact hole with a high aspect ratio for securing a sufficient overlap margin between the top of the side wall contact and a top inter-layer insulator.

It is a further object of the present invention to provide a novel method of forming a side wall contact on a side wall of a contact hole with a high aspect ratio for avoiding any further increase in total thickness of the inter-layer insulator.

It is yet a further object of the present invention to provide a novel side wall contact structure on a side wall of a contact hole with a high aspect ratio free from the above problems.

It is a further object of the present invention to provide a novel side wall contact on a side wall of a contact hole with a high aspect ratio for securing a sufficient overlap margin between the top of the side wall contact and a top inter-layer insulator.

It is a further object of the present invention to provide a novel side wall contact on a side wall of a contact hole with a high aspect ratio for avoiding any further increase in total thickness of the inter-layer insulator.

The present invention provides a method of forming a side wall contact on a side wall of a contact hole in an inter-layer insulator structure by an etch-back process. The method comprises the steps of: forming a first insulation film on a top insulation layer of the inter-layer insulator structure at least before forming a second insulation film, so that the second insulation film extends on the side wall and a bottom of the contact hole as well as on a surface of the first insulation film, wherein the first insulation film is higher in etching selectivity than the top insulation layer of the inter-layer insulator structure as well as the second insulation film is lower in etching selectivity than the top insulation layer of the inter-layer insulator structure, and the second insulation film is lower in etching selectivity than the first insulation film; and carrying out an etch back process in over-etching to the second insulation film by use of the first insulation film as an etching stopper so as to completely remove a bottom portion of the second insulation film on the bottom of the contact hole, thereby to form a side wall contact on the side wall of the contact hole, so that the side wall contact has a top level which lies between bottom and top levels of the top insulation layer.

The second present invention provides a method of forming a side wall contact on a side wall of a contact hole in an inter-layer insulator structure by an etch-back process, the method comprising the steps of: forming an etching stopper on a top insulation layer of the inter-layer insulator structure at least before forming a side wall contact film, so that the side wall contact film extends on the side wall and a bottom of the contact hole as well as on a surface of the etching stopper, wherein the side wall contact film is lower in etching selectivity than the top insulation layer of the inter-layer insulator structure; and carrying out an etch back process in over-etching to the side wall contact film so as to completely remove a bottom portion of the side wall contact film on the bottom of the contact hole, thereby forming a side wall contact on the side wall of the contact hole, so that the side wall contact has an over-lap margin with the top insulation layer.

The third present invention provides a side wall contact structure comprising: a contact hole in an inter-layer insulator structure having a top insulation layer; a first insulation film on a surface of the top insulation layer of the inter-layer insulator structure, wherein the first insulation film is made of a first insulation material which is higher in etching selectivity than the top insulation layer of the inter-layer insulator structure; and a side wall contact extending on the side wall of the contact hole, so that the side wall contact has a top level which lies between bottom and top levels of the top insulation layer, wherein the side wall contact is made of a second insulating material which is lower in etching selectivity than the top insulation layer of the inter-layer insulator structure and also the second insulating material is lower in etching selectivity than the first insulating material.

The fourth present invention provides a side wall contact structure comprising: a contact hole in an inter-layer insulator structure having a top insulation layer; and a side wall contact extending on the side wall of the contact hole, so that the side wall contact has a top level which lies between bottom and top levels of the top insulation layer, wherein the side wall contact is made of a second insulating material which is lower in etching selectivity than the top insulation layer of the inter-layer insulator structure.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

FIGS. 1A through 1E are fragmentary cross sectional elevation views illustrative of a conventional method of forming a conventional memory cell structure of a dynamic random access memory, wherein said conventional memory cell structure has a conventional side wall contact structure.

FIGS. 2A through 2E are fragmentary cross sectional elevation views illustrative of a novel method of forming a novel memory cell structure of a dynamic random access memory, wherein said novel memory cell structure has a novel side wall contact structure in accordance with the present invention.

DISCLOSURE OF THE INVENTION

Figure 1A:
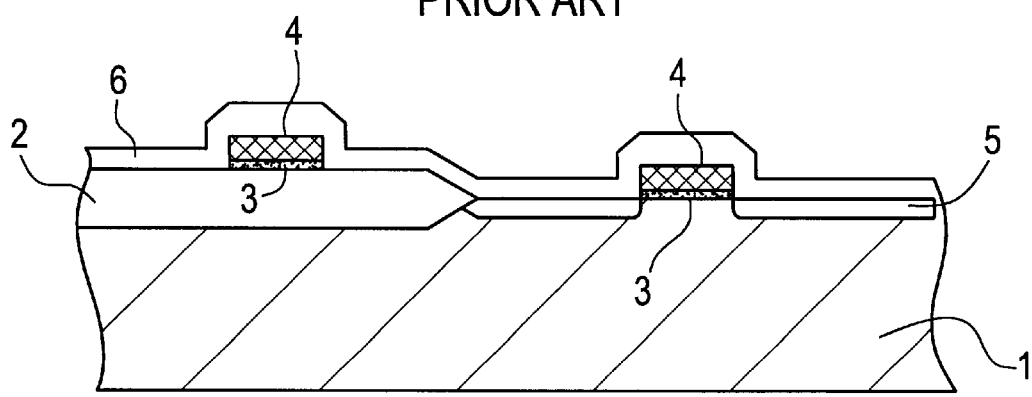
Figure 1B:
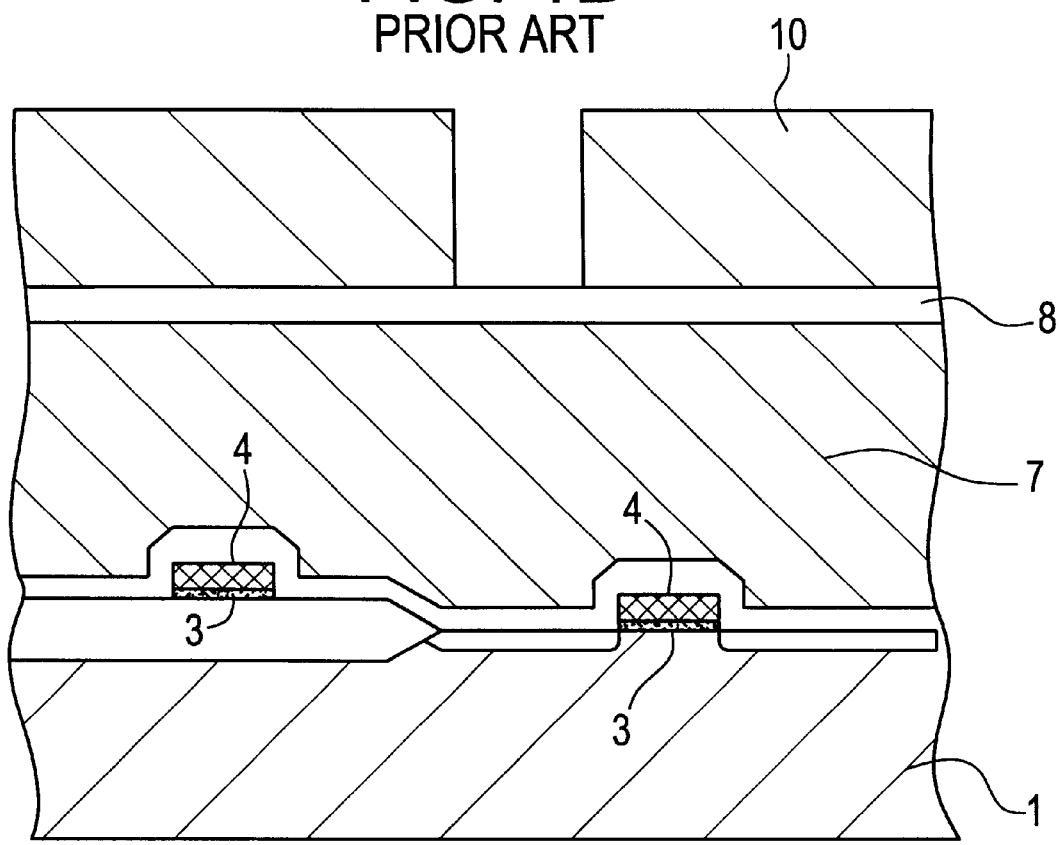
Figure 1D:
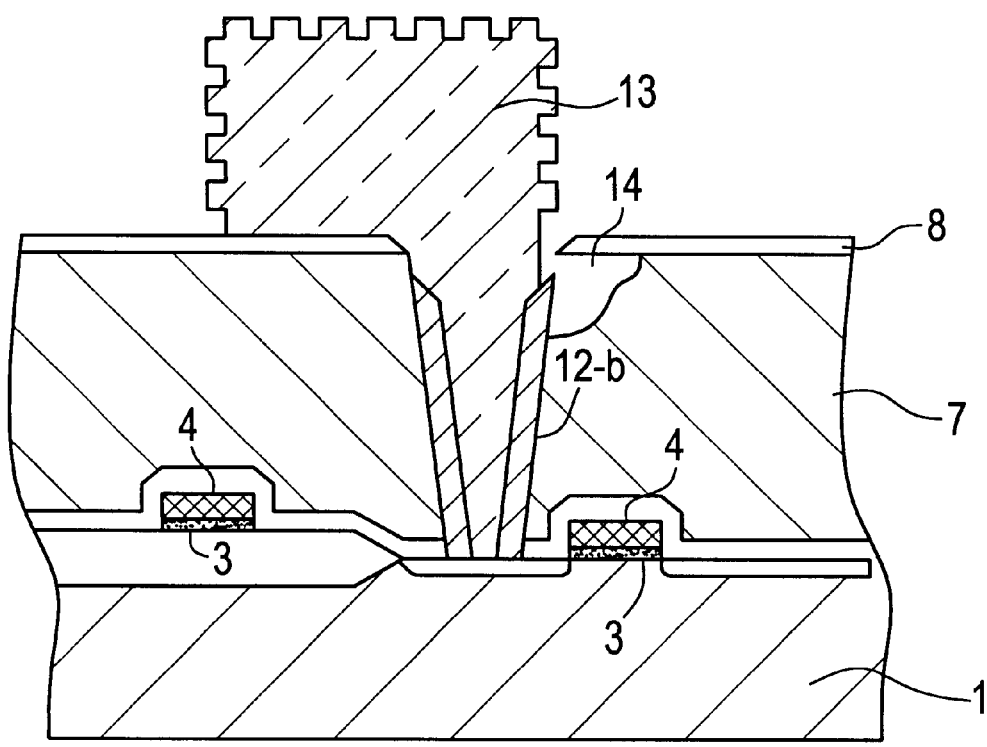
Figure 1E:
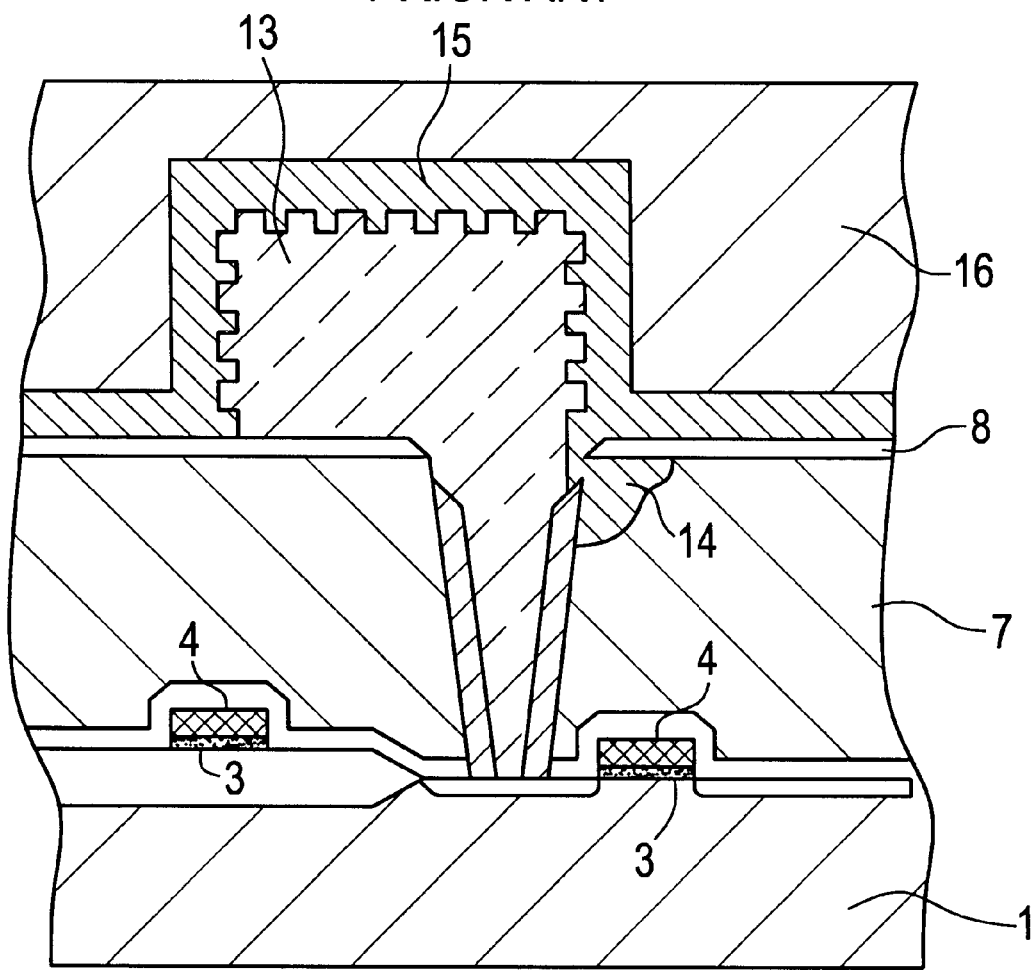

The present invention provides a method of forming a side wall contact on a side wall of a contact hole in an inter-layer insulator structure by an etch-back process. The method comprises the steps of: forming a first insulation film on a top insulation layer of the inter-layer insulator structure at least before forming a second insulation film, so that the second insulation film extends on the side wall and a bottom of the contact hole as well as on a surface of the first insulation film, wherein the first insulation film is higher in etching selectivity than the top insulation layer of the inter-layer insulator structure as well as the second insulation film is lower in etching selectivity than the top insulation layer of the inter-layer insulator structure, and the second insulation film is lower in etching selectivity than the first insulation film; and carrying out an etch back process in over-etching to the second insulation film by use of the first insulation film as an etching stopper so as to completely remove a bottom portion of the second insulation film on the bottom of the contact hole, thereby to form a side wall contact on the side wall of the contact hole, so that the side wall contact has a top level which lies between bottom and top levels of the top insulation layer.

It is also preferable to further comprise a step of removing any remaining parts of the first insulation film after the etch-back process has been carried out.

It is also preferable to further comprise a step of forming a conductive material within an inner space defined by the side wall contact on the side wall of the contact hole.

It is preferable that the contact hole has an aspect ratio of not less than about 4.

The above present invention may be applicable to a method of forming a semiconductor device comprising the steps of: forming a side wall contact in a contact hole in an inter-layer insulator structure over a semiconductor substrate in the above novel method; forming a storage electrode extending within and over the contact hole; forming a dielectric film on a surface of the storage electrode; and forming an opposite electrode on the dielectric film thereby to form a storage capacitor over the inter-layer insulator structure, wherein the storage capacitor is electrically connected to the semiconductor substrate through the contact hole.

In accordance with the above first present invention, the first insulation film acting as an etching stopper is formed on the fourth inter-layer insulator, provided that the first insulation film is made of an insulating material which has a first etching selectivity higher than an etching selectivity of an insulating material of a side wall contact to be formed later. A photo-resist is applied on the first insulation film and then subjected to exposure and subsequent development to form a photo-resist pattern over the first insulation film.

A dry etching process is carried out by use of the photo-resist pattern to selectively etch laminations of the fourth inter-layer insulator, the inter-layer insulator and the and the first inter-layer insulator, whereby a contact hole is formed which penetrates the laminations of the first insulation film, the fourth inter-layer insulator, the inter-layer insulator and the and the first inter-layer insulator, so that a part of the diffusion region is shown through the contact hole. The contact hole has a depth of about 1200 nanometers. An oxide film is entirely deposited so that the oxide film extends on a bottom and a side wall of the contact hole as well as on the surface of the fourth inter-layer insulator.

An etch back to the oxide film is carried out by use of a dry etching process for the purpose of removing the bottom part of the oxide film on the diffusion region and also the top parts of the oxide film on the first insulation film. It is necessary to completely remove the bottom part of the oxide film so that no residual part of the oxide film remains on the bottom of the contact hole, whereby the part of the diffusion region is shown through the contact hole.

If a diameter of the top portion of the contact hole is about 0.3 micrometers, then an aspect ratio of the contact hole is about 4. This high aspect ratio of the contact hole causes a micro-loading effect which reduces an etching rate of the oxide film in the deep region of the contact hole. Namely, the micro-loading effect causes the oxide film over the contact hole to be higher in etching rate than in the deep region of the contact hole. This means that, in order to exactly etch the bottom portion of the oxide film, it is necessary to allow an over-etching to the upper portion of the oxide film over the contact hole since the upper portion of the oxide film is higher in etching rate than the deep portion of the oxide film.

This over-etching to the upper portion of the oxide film causes that the top portion of the oxide film o n the surface of the first insulation film and a shallow portion of the oxide film positioned in a shallow region of the contact hole are etched, whereby the first insulation film is shown and subjected to the over-etching.

However, as described above, the first insulation film is made of the insulating material which has the first etching selectivity than the second etching selectivity of the oxide film so that the etching rate of the first insulation film is lower than the oxide film. The first insulation film is also higher in etching selectivity than the fourth inter-layer insulator to allow the first insulation film to act as the etching stopper for preventing the fourth inter-layer insulator to be etched and reduced in thickness.

This first insulation film is then removed by a selective etching so that the fourth inter-layer insulator is shown. The amount of the etched top portion of the oxide film depends upon the micro-loading effect enhanced by the high aspect ratio. A total thickness of the fourth inter-layer insulator and the first insulation film is decided in consideration of how much the etched top portion of the oxide film depends upon the micro-loading effect enhanced by the high aspect ratio, so that the top portion of the oxide film drops in level whereby the top level of the etched oxide film becomes lower than the top level of the fourth inter-layer insulator but higher than the bottom level of the fourth inter-layer insulator.

Namely, in order to exactly etch the bottom portion of the oxide film, the over-etching is continued until the shallower portion of the oxide film in the shallower region of the contact hole is etched, whereby the oxide film is made into a side wall contact which extends on the side wall of the contact hole except on a shallower region of the contact hole. The top portion of the side wall contact lies lower in level than the top of the fourth inter-layer insulator but higher in level than the bottom of the fourth inter-layer insulator, whereby the upper region of the inter-layer insulator remains isolated by the side wall contact from the contact hole.

After the etch-back process has been carried out, an overlap margin remains between the side wall contact and the fourth inter-layer insulator. The used first insulation film as the etching stopper is removed by a selective etching. The provision of the first insulation film acting as the etching stopper over the fourth inter-layer insulator reduces the necessary thickness of the fourth inter-layer insulator for allowing that the top level of the side wall contact lies below the top level of the fourth inter-layer insulator but above the bottom level of the fourth inter-layer insulator so as to form the overlap margin between the top potion of the first insulation film and the fourth inter-layer insulator.

A storage electrode made of polysilicon is then formed which fills the contact hole and extends over the contact hole and the fourth inter-layer insulator. As the requirement for scaling down the storage capacitor increases, it is possible that an alignment of the storage electrode to the contact hole will deteriorate so that a part of the top portion of the contact hole is shown without complete coverage of the top portion of the contact hole with the storage electrode.

As the next process, a wet etching with a hydrofluoric acid etchant in an HSG technique is carried out to increase the roughness of the surface of the storage electrode thereby increasing the surface area of the storage electrode for increasing the capacitance without increasing the occupied area of the storage capacitor. The above overlap margin between the side wall contact and the fourth inter-layer insulator also exactly isolate the top portion of the inter-layer insulator from the etchant of the wet etching. This wet etching process is selected so that no part of the inter-layer insulator is etched with the etchant, whereby no etched hollow portion is formed in the inter-layer insulator.

A capacitive dielectric film is formed on the surface of the storage electrode. A plate electrode is then formed on the capacitive dielectric film so that the capacitive dielectric film is sandwiched by the storage electrode and the plate electrode. By preventing formation of the etched hollow portion, there is no deterioration in the coverage of the capacitive dielectric film and the plate electrode. No deterioration in coverage of the capacitive dielectric film and the plate electrode prevents the corresponding increase in the leakage of current through the capacitive dielectric film.

The provision of the first insulation film does settle the above problem with the conventional technique. If a large amount of over-etching is required in view of the enhanced micro-loading effect caused by the high aspect ratio of the contact hole, then the thickness of the first insulation film is increased whilst the fourth inter-layer insulator remains thin so that after the first insulation film used as the etching stopper in the etch-back process is removed, then the depth of the further contact hole to be formed later depends upon the total thickness of the first inter-layer insulator, the inter-layer insulator and the fourth inter-layer insulator without the first insulation film.

Namely, the existence of the first insulation film results in a reduction in depth of the other contact hole to be formed later, whereby the aspect ratio of the other contact hole to be formed is also reduced. The reduction in aspect ratio of the other contact hole reduces the micro-loading effect. The reduction in micro-loading effect reduces the necessary over-etching amount of the oxide film on the side wall of the other contact hole to form the other side wall contact on the side wall of the other contact hole. This reduces the necessary over-etching amount of the oxide film on the side wall of the other contact hole, thereby preventing the above problems with the conventional techniques.

The second present invention provides a method of forming a side wall contact on a side wall of a contact hole in an inter-layer insulator structure by an etch-back process, the method comprising the steps of: forming an etching stopper on a top insulation layer of the inter-layer insulator structure at least before forming a side wall contact film, so that the side wall contact film extends on the side wall and a bottom of the contact hole as well as on a surface of the etching stopper, wherein the side wall contact film is lower in etching selectivity than the top insulation layer of the inter-layer insulator structure; and carrying out an etch back process in over-etching to the side wall contact film so as to completely remove a bottom portion of the side wall contact film on the bottom of the contact hole, thereby forming a side wall contact on the side wall of the contact hole, so that the side wall contact has an over-lap margin with the top insulation layer.

It is also preferable to further comprise a step of removing any remaining parts of the etching stopper after the etch-back process has been carried out.

It is also preferable to further comprise a step of forming a conductive material within an inner space defined by the side wall contact on the side wall of the contact hole.

It is also preferable that the contact hole has an aspect ratio of not less than about 4.

The above second present invention may be applicable to a method of forming a semiconductor device comprising the steps of: forming a side wall contact in a contact hole in an inter-layer insulator structure over a semiconductor substrate in the above second method; forming a storage electrode extending within and over the contact hole; forming a dielectric film on a surface of the storage electrode; and forming an opposite electrode on the dielectric film thereby to form a storage capacitor over the inter-layer insulator structure, wherein the storage capacitor is electrically connected to the semiconductor substrate through the contact hole.

In accordance with the above second present invention, the etching stopper film acting as an etching stopper is formed on the fourth inter-layer insulator, provided that the etching stopper film is made of an insulating material which has a first etching selectivity higher than an etching selectivity of an insulating material of a side wall contact to be formed later. A photo-resist is applied on the etching stopper film and then subjected to exposure and subsequent development to form a photo-resist pattern over the etching stopper film.

A dry etching process is carried out by use of the photo-resist pattern to selectively etch laminations of the fourth inter-layer insulator, the inter-layer insulator and the and the first inter-layer insulator, whereby a contact hole is formed which penetrates the laminations of the etching stopper film, the fourth inter-layer insulator, the inter-layer insulator and the and the first inter-layer insulator, so that a part of the diffusion region is shown through the contact hole. The contact hole has a depth of about 1200 nanometers. An oxide film is entirely deposited so that the oxide film extends on a bottom and a side wall of the contact hole as well as on the surface of the fourth inter-layer insulator.

An etch back to the oxide film is carried out by use of a dry etching process for the purpose of removing the bottom part of the oxide film on the diffusion region and also the top parts of the oxide film on the etching stopper film. It is necessary to completely remove the bottom part of the oxide film so that no residual part of the oxide film remains on the bottom of the contact hole, whereby the part of the diffusion region is shown through the contact hole.

If a diameter of the top portion of the contact hole is about 0.3 micrometers, then an aspect ratio of the contact hole is about 4. This high aspect ratio of the contact hole causes a micro-loading effect which reduces an etching rate of the oxide film in the deep region of the contact hole. Namely, the micro-loading effect causes the oxide film over the contact hole to be higher in etching rate than in the deep region of the contact hole. This means that, in order to exactly etch the bottom portion of the oxide film, it is necessary to allow an over-etching to the upper portion of the oxide film over the contact hole since the upper portion of the oxide film is higher in etching rate than the deep portion of the oxide film. This over-etching to the upper portion of the oxide film causes the etching of the top portion of the oxide film on the surface of the etching stopper film and a shallow portion of the oxide film positioned in a shallow region of the contact hole, whereby the etching stopper film is exposed and subjected to the over-etching.

However, as described above, the etching stopper film is made of the insulating material which has an etching selectivity such that the etching rate of the etching stopper film is lower than the oxide film. The etching stopper film is also higher in etching selectivity than the fourth inter-layer insulator to allow the etching stopper film to act as the etching stopper for preventing the fourth inter-layer insulator to be etched and reduced in thickness. This etching stopper film is then removed by a selective etching so that the fourth inter-layer insulator is shown. The amount of the etched top portion of the oxide film depends upon the micro-loading effect enhanced by the high aspect ratio.

A total thickness of the fourth inter-layer insulator and the etching stopper film is decided in consideration of the amount of the etched top portion of the oxide film depends upon the micro-loading effect enhanced by the high aspect ratio, so that the top portion of the oxide film drops in level whereby the top level of the etched oxide film becomes lower than the top level of the fourth inter-layer insulator but higher than the bottom level of the fourth inter-layer insulator.

Namely, in order to exactly etch the bottom portion of the oxide film, the over-etching is continued until the shallower portion of the oxide film in the shallower region of the contact hole is etched, whereby the oxide film is made into a side wall contact which extends on the side wall of the contact hole except on a shallower region of the contact hole. The top portion of the side wall contact lies lower in level than the top of the fourth inter-layer insulator but higher in level than the bottom of the fourth inter-layer insulator, whereby the upper region of the inter-layer insulator remains isolated by the side wall contact from the contact hole.

After the etch-back process has been carried out, an overlap margin remains between the side wall contact and the fourth inter-layer insulator. The etching stopper film is removed by a selective etching. The provision of the etching stopper film acting as the etching stopper over the fourth inter-layer insulator reduces the necessary thickness of the fourth inter-layer insulator for allowing that the top level of the side wall contact lies below the top level of the fourth inter-layer insulator but above the bottom level of the fourth inter-layer insulator so as to form the overlap margin between the top potion of the etching stopper film and the fourth inter-layer insulator.

A storage electrode made of polysilicon is then formed which fills the contact hole and extends over the contact hole and the fourth inter-layer insulator. As the requirement for scaling down the storage capacitor increases, it is possible that an alignment of the storage electrode to the contact hole will deteriorate so that a part of the top portion of the contact hole is shown without complete coverage of the top portion of the contact hole with the storage electrode.

As the next process, a wet etching with a hydrofluoric acid etchant in an HSG technique is carried out to increase the roughness of the surface of the storage electrode thereby increasing the surface area of the storage electrode for increasing the capacitance without increasing the occupied area of the storage capacitor. The above overlap margin between the side wall contact and the fourth inter-layer insulator also exactly isolate the top portion of the inter-layer insulator from the etchant of the wet etching. This wet etching process is selected so that no part of the inter-layer insulator is etched with the etchant, whereby no etched hollow portion is formed in the inter-layer insulator.

A capacitive dielectric film is formed on the surface of the storage electrode. A plate electrode is then formed on the capacitive dielectric film so that the capacitive dielectric film is sandwiched by the storage electrode and the plate electrode. By preventing formation of the etched hollow portion, there is no deterioration in the coverage of the capacitive dielectric film and the plate electrode. No deterioration in coverage of the capacitive dielectric film and the plate electrode prevents the corresponding increase in the leakage of current through the capacitive dielectric film.

The provision of the etching stopper film does settle the above problem with the conventional technique. If a large amount of over-etching is required in view of the enhanced micro-loading effect caused by the high aspect ratio of the contact hole, then the thickness of the etching stopper film is increased whilst the fourth inter-layer insulator remains thin so that after the etching stopper film used as the etching stopper in the etch-back process is removed, then the depth of the further contact hole to be formed later depends upon the total thickness of the first inter-layer insulator, the inter-layer insulator and the fourth inter-layer insulator without the etching stopper film. Namely, the existence of the etching stopper film results in a reduction in depth of the other contact hole to be formed later, whereby the aspect ratio of the other contact hole to be formed is also reduced.

The reduction in aspect ratio of the other contact hole reduces the micro-loading effect. The reduction in micro-loading effect reduces the necessary over-etching amount of the oxide film on the side wall of the other contact hole to form the other side wall contact on the side wall of the other contact hole. This reduces the necessary over-etching amount of the oxide film on the side wall of the other contact hole, thereby preventing the above problems with the conventional techniques.

The third present invention provides a side wall contact structure comprising: a contact hole in an inter-layer insulator structure having a top insulation layer; a first insulation film on a surface of the top insulation layer of the inter-layer insulator structure, wherein the first insulation film is made of a first insulation material which is higher in etching selectivity than the top insulation layer of the inter-layer insulator structure; and a side wall contact extending on the side wall of the contact hole, so that the side wall contact has a top level which lies between bottom and top levels of the top insulation layer, wherein the side wall contact is made of a second insulating material which is lower in etching selectivity than the top insulation layer of the inter-layer insulator structure and also the second insulating material is lower in etching selectivity than the first insulating material.

It is also preferable to further comprise a conductive material within an inner space defined by the side wall contact on the side wall of the contact hole.

It is also preferable that the contact hole has an aspect ratio of not less than about 4.

The above third present invention is also applicable to a semiconductor device comprising: a semiconductor substrate; an inter-layer insulator structure with a side wall contact structure over the semiconductor substrate; and a storage capacitor positioned over the inter-layer insulator structure and connected to the semiconductor substrate through the contact hole.

In accordance with the above first present invention, the first insulation film acting as an etching stopper is formed on the fourth inter-layer insulator, provided that the first insulation film is made of an insulating material which has a first etching selectivity higher than an etching selectivity of an insulating material of a side wall contact to be formed later. A photo-resist is applied on the first insulation film and then subjected to exposure and subsequent development to form a photo-resist pattern over the first insulation film.

A dry etching process is carried out by use of the photo-resist pattern to selectively etch laminations of the fourth inter-layer insulator, the inter-layer insulator and the and the first inter-layer insulator, whereby a contact hole is formed which penetrates the laminations of the first insulation film, the fourth inter-layer insulator, the inter-layer insulator and the and the first inter-layer insulator, so that a part of the diffusion region is shown through the contact hole. The contact hole has a depth of about 1200 nanometers. An oxide film is entirely deposited so that the oxide film extends on a bottom and a side wall of the contact hole as well as on the surface of the fourth inter-layer insulator.

An etch back to the oxide film is carried out by use of a dry etching process for the purpose of removing the bottom part of the oxide film on the diffusion region and also the top parts of the oxide film on the first insulation film. It is necessary to completely remove the bottom part of the oxide film so that no residual part of the oxide film remains on the bottom of the contact hole, whereby the part of the diffusion region is shown through the contact hole.

If a diameter of the top portion of the contact hole is about 0.3 micrometers, then an aspect ratio of the contact hole is about 4. This high aspect ratio of the contact hole causes a micro-loading effect which reduces an etching rate of the oxide film in the deep region of the contact hole. Namely, the micro-loading effect causes the oxide film over the contact hole to be higher in etching rate than in the deep region of the contact hole. This means that, in order to exactly etch the bottom portion of the oxide film, it is necessary to allow an over-etching to the upper portion of the oxide film over the contact hole since the upper portion of the oxide film is higher in etching rate than the deep portion of the oxide film. This over-etching to the upper portion of the oxide film causes the etching of the top portion of the oxide film on the surface of the first insulation film and a shallow portion of the oxide film positioned in a shallow region of the contact hole, whereby the first insulation film is exposed and subjected to the over-etching.

However, as described above, the first insulation film is made of the insulating material which has an etching selectivity such that the etching rate of the first insulation film is lower than the oxide film. The first insulation film is also higher in etching selectivity than the fourth inter-layer insulator to allow the first insulation film to act as the etching stopper for preventing the fourth inter-layer insulator to be etched and reduced in thickness. This first insulation film is then removed by a selective etching so that the fourth inter-layer insulator is shown. The amount of the etched top portion of the oxide film depends upon the micro-loading effect enhanced by the high aspect ratio.

A total thickness of the fourth inter-layer insulator and the first insulation film is decided in consideration of the amount of the etched top portion of the oxide film depends upon the micro-loading effect enhanced by the high aspect ratio, so that the top portion of the oxide film drops in level whereby the top level of the etched oxide film becomes lower than the top level of the fourth inter-layer insulator but higher than the bottom level of the fourth inter-layer insulator.

Namely, in order to exactly etch the bottom portion of the oxide film, the over-etching is continued until the shallower portion of the oxide film in the shallower region of the contact hole is etched, whereby the oxide film is made into a side wall contact which extends on the side wall of the contact hole except on a shallower region of the contact hole. The top portion of the side wall contact lies lower in level than the top of the fourth inter-layer insulator but higher in level than the bottom of the fourth inter-layer insulator, whereby the upper region of the inter-layer insulator remains isolated by the side wall contact from the contact hole.

After the etch-back process has been carried out, an overlap margin remains between the side wall contact and the fourth inter-layer insulator. The first insulation film is removed by a selective etching. The provision of the first insulation film acting as the etching stopper over the fourth inter-layer insulator reduces the necessary thickness of the fourth inter-layer insulator for allowing that the top level of the side wall contact lies below the top level of the fourth inter-layer insulator but above the bottom level of the fourth inter-layer insulator so as to form the overlap margin between the top potion of the first insulation film and the fourth inter-layer insulator.

A storage electrode made of polysilicon is then formed which fills the contact hole and extends over the contact hole and the fourth inter-layer insulator. As the requirement for scaling down the storage capacitor increases, it is possible that an alignment of the storage electrode to the contact hole will deteriorate so that a part of the top portion of the contact hole is shown without complete coverage of the top portion of the contact hole with the storage electrode.

As the next process, a wet etching with a hydrofluoric acid etchant in an HSG technique is carried out to increase the roughness of the surface of the storage electrode thereby increasing the surface area of the storage electrode for increasing the capacitance without increasing the occupied area of the storage capacitor. The above overlap margin between the side wall contact and the fourth inter-layer insulator also exactly isolates the top portion of the inter-layer insulator from the etchant of the wet etching. This wet etching process is selected so that no part of the inter-layer insulator is etched with the etchant, whereby no etched hollow portion is formed in the inter-layer insulator. A capacitive dielectric film is formed on the surface of the storage electrode.

A plate electrode is then formed on the capacitive dielectric film so that the capacitive dielectric film is sandwiched by the storage electrode and the plate electrode. By preventing formation of the etched hollow portion, there is no deterioration in the coverage of the capacitive dielectric film and the plate electrode. No deterioration in coverage of the capacitive dielectric film and the plate electrode prevents the corresponding increase in the leakage of current through the capacitive dielectric film.

The provision of the first insulation film does settle the above problem with the conventional technique. If a large amount of over-etching is required in view of the enhanced micro-loading effect caused by the high aspect ratio of the contact hole, then the thickness of the first insulation film is increased whilst the fourth inter-layer insulator remains thin so that after the first insulation film used as the etching stopper in the etch-back process is removed, then the depth of the further contact hole to be formed later depends upon the total thickness of the first inter-layer insulator, the inter-layer insulator and the fourth inter-layer insulator without the first insulation film. Namely, the existence of the first insulation film results in a reduction in depth of the other contact hole to be formed later, whereby the aspect ratio of the other contact hole to be formed is also reduced.

The reduction in aspect ratio of the other contact hole reduces the micro-loading effect. The reduction in micro-loading effect reduces the necessary over-etching amount of the oxide film on the side wall of the other contact hole to form the other side wall contact on the side wall of the other contact hole. This reduces the necessary over-etching amount of the oxide film on the side wall of the other contact hole, thereby preventing the above problems with the conventional techniques.

The fourth present invention provides a side wall contact structure comprising: a contact hole in an inter-layer insulator structure having a top insulation layer; and a side wall contact extending on the side wall of the contact hole, so that the side wall contact has a top level which lies between bottom and top levels of the top insulation layer, wherein the side wall contact is made of a second insulating material which is lower in etching selectivity than the top insulation layer of the inter-layer insulator structure.

It is further preferable to further comprise a conductive material within an inner space defined by the side wall contact on the side wall of the contact hole.

It is further preferable that the contact hole has an aspect ratio of not less than about 4.

The above fourth present invention may also be applicable to a semiconductor device comprising: a semiconductor substrate; an inter-layer insulator structure with a side wall contact structure in a contact hole in the inter-layer insulator structure over the semiconductor substrate, the side wall contact extending on the side wall of the contact hole so that the side wall contact has a top level which lies between bottom and top levels of a top insulation layer of the inter-layer insulator structure, the side wall contact being made of an insulating material which is lower in etching selectivity than the top insulation layer of the inter-layer insulator structure; and a storage capacitor positioned over the inter-layer insulator structure and connected to the semiconductor substrate through the contact hole.

PREFERRED EMBODIMENTS

A first embodiment according to the present invention will be described. A novel method of forming a memory cell structure of the dynamic random access memory will be described. FIGS. 2A through 2E are fragmentary cross sectional elevation views illustrative of a novel method of forming a novel memory cell structure of a dynamic random access memory, wherein said novel memory cell structure has a novel side wall contact structure.

Figure 2A:
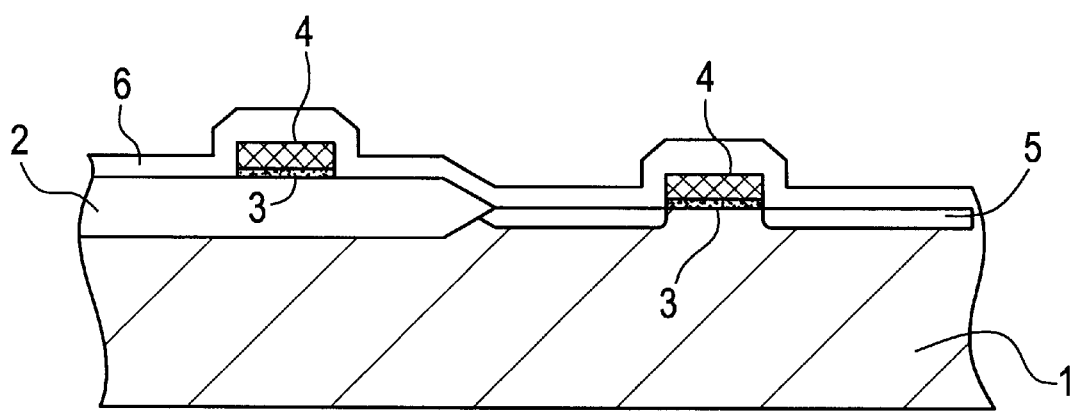

With reference to FIG. 2A, field oxide films 2 are selectively formed on a passive region of a p-type silicon substrate 1 to define an active region. Gate oxide films 3 are formed on a part of the field oxide film 2 and the active region of the silicon substrate 1. First and second gate electrodes 4 of a polysilicon film which also act as word lines are formed on the gate oxide film 3. The gate electrode 4 is positioned over a channel region in the active region of the substrate 1. Source and drain diffusion regions 5 of n⁻-type are selectively formed by self-alignment on the other active regions than the channel region of the substrate 1, whereby the source and drain diffusion regions 5 define the channel region. A first inter-layer insulator 6 is entirely formed which extends over the passive regions and the active regions of the substrate 1 so that the first inter-layer insulator 6 covers the field oxide film 2, the gate electrodes 4 and the source and drain diffusion regions 5.

Figure 2B:
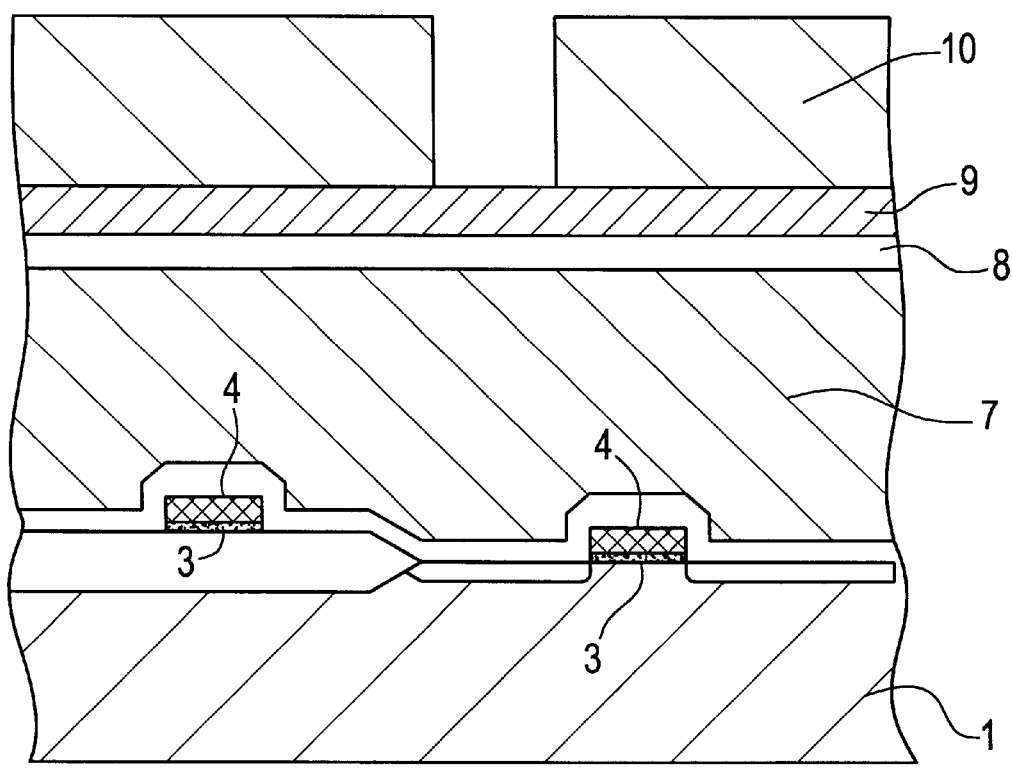

With reference to FIG. 2B, a second inter-layer insulator made of boro-phospho silicate glass from tetraethyl orthosilicate is formed on the first inter-layer insulator 6. The second inter-layer insulator is much thicker than the first inter-layer insulator 6. Although illustration is omitted, bit contacts and bit lines are formed.

The bit contacts are to provide electrical connections between the bit lines and the source and drain regions. The bit contacts and the bit lines may be formed by well known techniques of the photo-lithography and subsequent dry etching. The bit lines may be made of second polysilicon.

A third inter-layer insulator made of boro-phospho silicate glass from tetraethyl orthosilicate is formed on the second inter-layer insulator and over the bit lines, whereby an inter-layer insulator 7 of the second and third inter-layer insulators is then formed.

A fourth inter-layer insulator 8 is formed on the inter-layer insulator 7. The fourth inter-layer insulator 8 may be made of a different insulating material such as silicon dioxide from the second and third inter-layer insulators. The fourth inter-layer insulator 8 is much thinner than the inter-layer insulator 7. The thickness of the fourth inter-layer insulator 8 is, for example, in the range of about 150–200 nanometers.

An additional insulation film 9 acting as an etching stopper is then formed on the fourth inter-layer insulator 8, provided that the additional insulation film 9 is made of an insulating material which has a first etching selectivity higher than an etching selectivity of an insulating material of a side wall contact to be formed later. One of the available material of the additional insulation film 9 is silicon nitride. A thickness of the additional insulation film 9 is in a range of about 50–100 nanometers. A photo-resist is applied on the additional insulation film 9 and then subjected to exposure and subsequent development to form a photo-resist pattern 10 over the additional insulation film 9.

With reference to FIG. 2C, a dry etching process is carried out by use of the photo-resist pattern 10 to selectively etch laminations of the fourth inter-layer insulator 8, the inter-layer insulator 7 and the and the first inter-layer insulator 6, whereby a contact hole 11 is formed which penetrates the laminations of the additional insulation film 9, the fourth inter-layer insulator 8, the inter-layer insulator 7 and the and the first inter-layer insulator 6, so that a part of the diffusion region 5 is shown through the contact hole 11. The contact hole 11 has a depth of about 1200 nanometers. An oxide film 12-*a* made of NSG from TEOS is entirely deposited so that the oxide film 12-*a* extends on a bottom and a side wall of the contact hole as well as on the surface of the fourth inter-layer insulator 8.

Figure 2D:
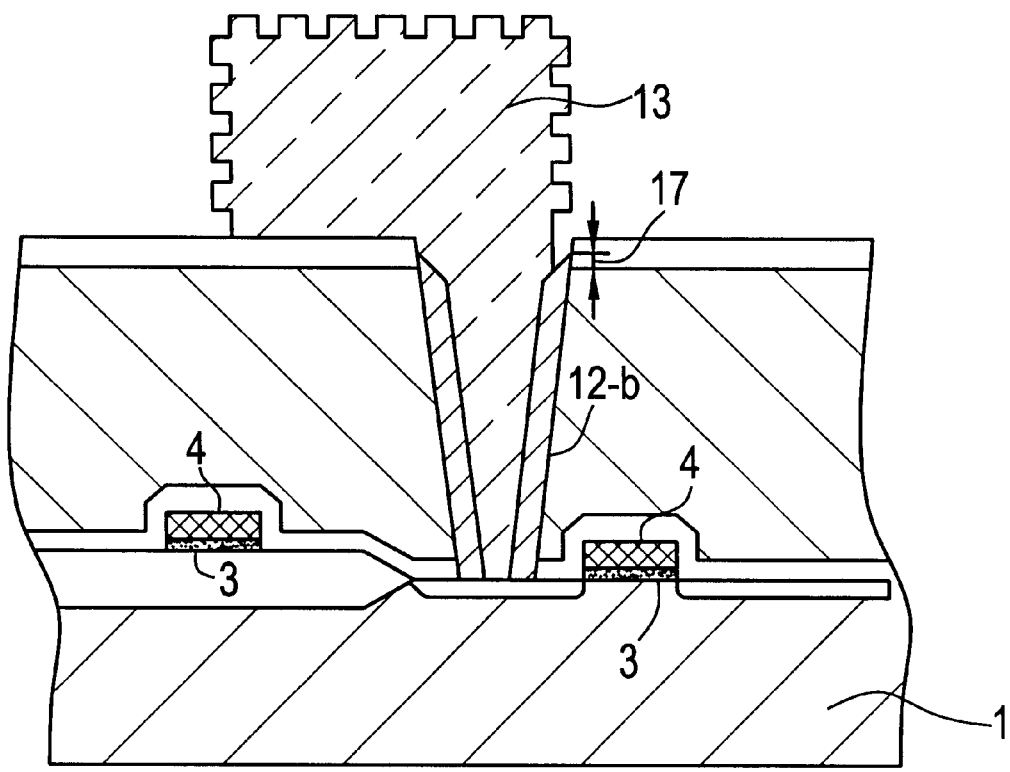

With reference to FIG. 2D, an etch back to the oxide film 12-*a* is carried out by use of a dry etching process for the purpose of removing the bottom part of the oxide film 12-*a* on the diffusion region 5 and also the top parts of the oxide film 12-*a* on the additional insulation film 9. It is necessary to completely remove the bottom part of the oxide film 12-*a* so that no residual part of the oxide film 12-*a* remains on the bottom of the contact hole 11, whereby the part of the diffusion region 5 is shown through the contact hole 11.

If a diameter of the top portion of the contact hole 11 is about 0.3 micrometers, then an aspect ratio of the contact hole 11 is about 4. This high aspect ratio of the contact hole causes a micro-loading effect which reduces an etching rate of the oxide film 12-*a* in the deep region of the contact hole 11. Namely, the micro-loading effect causes the oxide film 12-*a* over the contact hole 11 to be higher in etching rate than in the deep region of the contact hole 11. This means that, in order to exactly etch the bottom portion of the oxide film 12-*a*, it is necessary to allow an over-etching to the upper portion of the oxide film 12-*a* over the contact hole 11 since the upper portion of the oxide film 12-*a* is higher in etching rate than the deep portion of the oxide film 12-*a*. This over-etching to the upper portion of the oxide film 12-*a* causes that the top portion of the oxide film 12-*a* on the surface of the additional insulation film 9 and a shallow portion of the oxide film 12-*a* positioned in a shallow region of the contact hole 11 are etched, whereby the additional insulation film 9 is shown and subjected to the over-etching.

However, as described above, the additional insulation film 9 is made of the insulating material which has the first etching selectivity rather than the second etching selectivity of the oxide film 12-*b* so that the etching rate of the additional insulation film 9 is lower than the oxide film 12-*b*. The additional insulation film 9 is also higher in etching selectivity than the fourth inter-layer insulator 8 to allow the additional insulation film 9 to act as the etching stopper for preventing the fourth inter-layer insulator 8 from being etched and reduced in thickness. This additional insulation film 9 is then removed by a selective etching so that the fourth inter-layer insulator 8 is shown. The amount of the etched top portion of the oxide film 12-*a* depends upon the micro-loading effect enhanced by the high aspect ratio.

A total thickness of the fourth inter-layer insulator 8 and the additional insulation film 9 is decided in consideration of the amount of the etched top portion of the oxide film 12-*a* depends upon the micro-loading effect enhanced by the high aspect ratio, so that the top portion of the oxide film 12-*a* drops in level whereby the top level of the etched oxide film 12-*a* becomes lower than the top level of the fourth inter-layer insulator 8 but higher than the bottom level of the fourth inter-layer insulator 8.

Namely, in order to exactly etch the bottom portion of the oxide film 12-*a*, the over-etching is continued until the shallower portion of the oxide film 12-*a* in the shallower region of the contact hole 11 is etched, whereby the oxide film 12-*a* is made into a side wall contact 12-*b* which extends on the side wall of the contact hole 11 except on a shallower region of the contact hole 11. The top portion of the side wall contact 12-*b* lies lower in level than the top of the fourth inter-layer insulator 8 but higher in level than the bottom of the fourth inter-layer insulator 8, whereby the upper region of the inter-layer insulator 7 remains isolated by the side wall contact from the contact hole 11.

After the etch-back process has been carried out, then an overlap margin remains between the side wall contact 12-*b* and the fourth inter-layer insulator 8. The used additional insulation film 9 as the etching stopper is removed by a selective etching. The provision of the additional insulation film 9 acting as the etching stopper over the fourth inter-layer insulator 8 reduces the necessary thickness of the fourth inter-layer insulator 8 for allowing that the top level of the side wall contact 12-*b* lies below the top level of the fourth inter-layer insulator 8 but above the bottom level of the fourth inter-layer insulator 8 so as to form the overlap margin between the top portion of the additional insulation film 9 and the fourth inter-layer insulator 8.

A storage electrode 13 made of polysilicon is then formed which fills the contact hole 11 and extends over the contact hole 11 and the fourth inter-layer insulator 8. As the requirement for scaling down the storage capacitor has been on the increase, it is possible that an alignment of the storage electrode 13 to the contact hole may deteriorate so that a part of the top portion of the contact hole 11 is shown without complete coverage of the top portion of the contact hole 11 with the storage electrode 13.

As the next process, a wet etching with a hydrofluoric acid etchant in an HSG technique is carried out to increase the roughness of the surface of the storage electrode 13 thereby increasing the surface area of the storage electrode 13 for increasing the capacitance without increasing the occupied area of the storage capacitor. The above overlap margin between the side wall contact 12-*b* and the fourth inter-layer insulator 8 also exactly isolate the top portion of the inter-layer insulator 7 from the etchant of the wet etching. This wet etching process causes no part of the inter-layer insulator 7 to be etched with the etchant, whereby no etched hollow portion is formed in the inter-layer insulator 7.

Figure 2E:
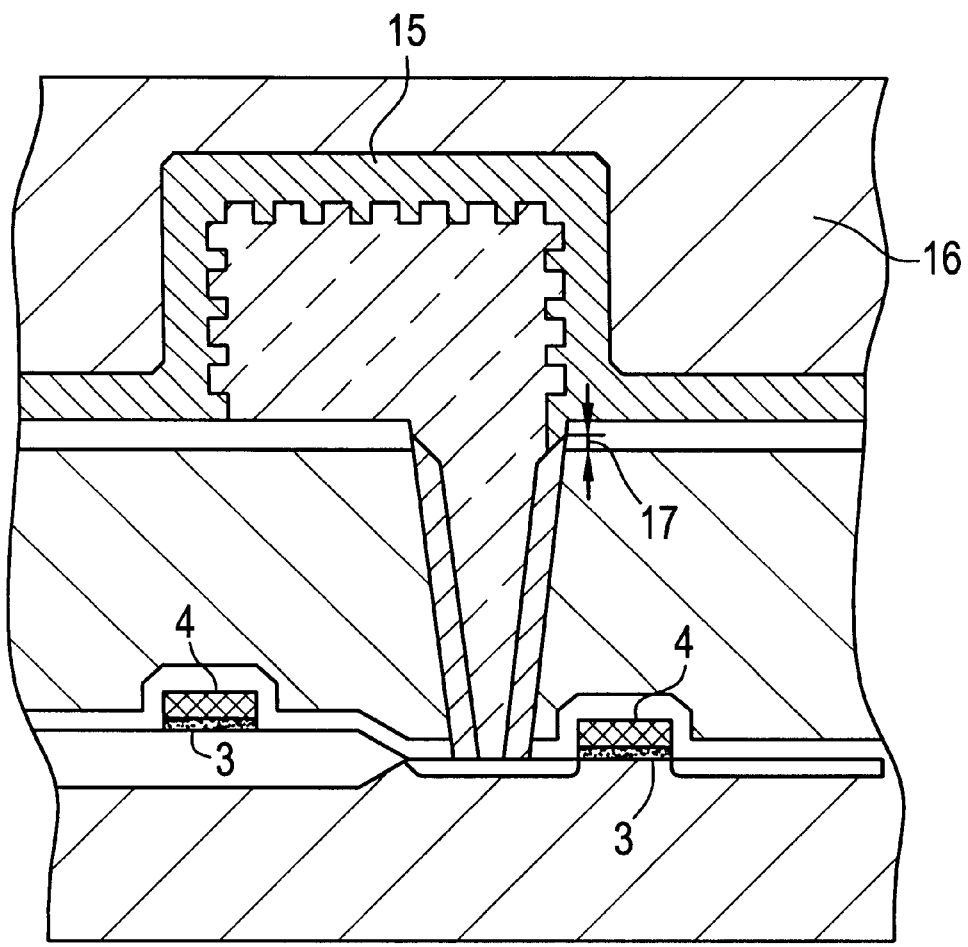

With reference to FIG. 2E, a capacitive dielectric film 15 is formed on the surface of the storage electrode 13. A plate electrode 16 is then formed on the capacitive dielectric film 15 so that the capacitive dielectric film 15 is sandwiched by the storage electrode 13 and the plate electrode 16. No etched hollow portion 14 is formed, preventing the deterioration in coverage of the capacitive dielectric film 15 and the plate electrode 16. No deterioration in coverage of the capacitive dielectric film 15 and the plate electrode 16 results in no increase in the leakage of current through the capacitive dielectric film 15.

The provision of the additional insulation film 9 does settle the above problem with the conventional technique. If a large amount of over-etching is required in view of the enhanced micro-loading effect caused by the high aspect ratio of the contact hole, then the thickness of the additional insulation film 9 is increased whilst the fourth inter-layer insulator 8 remains thin so that after the additional insulation film 9 as used as the etching stopper in the etch-back process is removed, then the depth of the further contact hole to be formed later depends upon the total thickness of the first inter-layer insulator 6, the inter-layer insulator 7 and the fourth inter-layer insulator 8 without the additional insulation film 9.

Namely, the existence of the additional insulation film 9 results in a reduction in depth of the other contact hole to be formed later, whereby the aspect ratio of the other contact hole to be formed is also reduced. The reduction in aspect ratio of the other contact hole reduces the micro-loading effect. The reduction in micro-loading effect reduces the necessary over-etching amount of the oxide film on the side wall of the other contact hole to form the other side wall contact on the side wall of the other contact hole. This reduces the necessary over-etching amount of the oxide film on the side wall of the other contact hole, thereby preventing the above problems with the conventional techniques.

Figure 3:
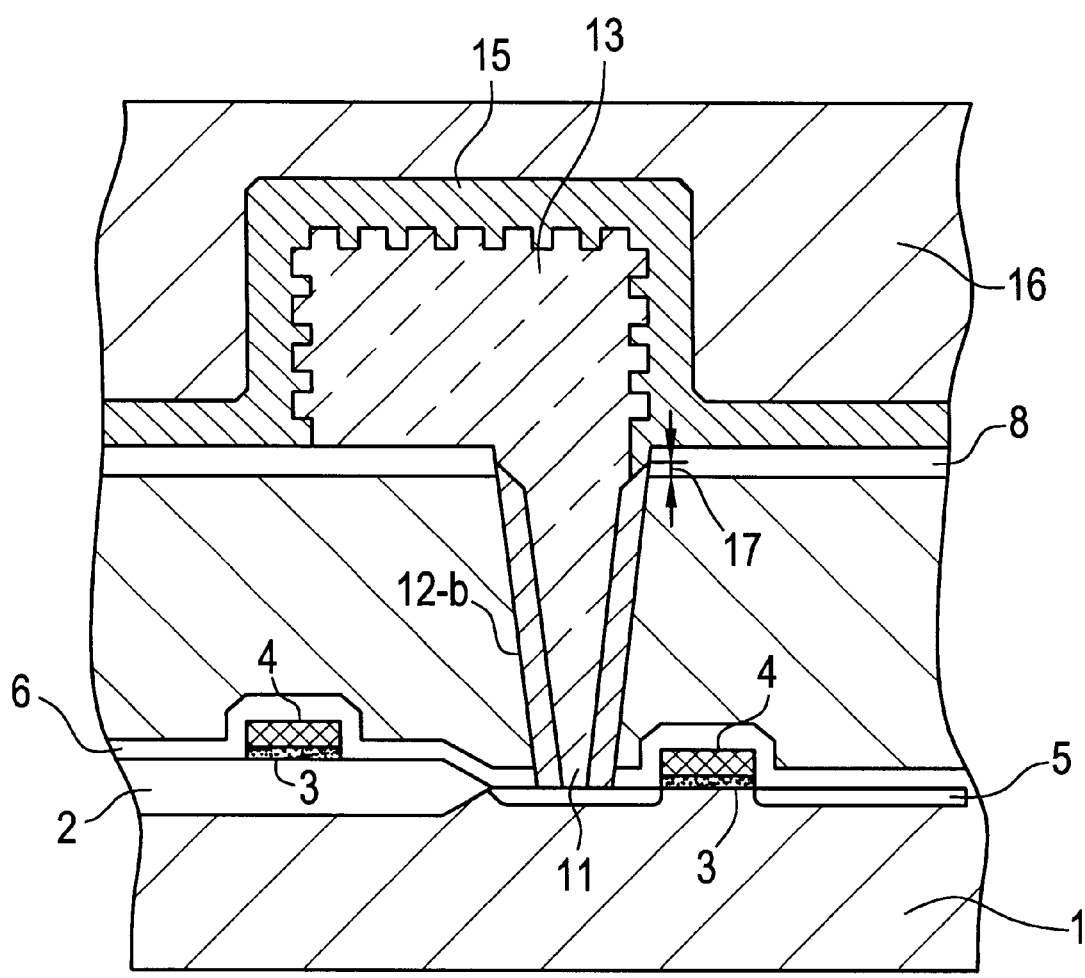
FIG. 3 is a fragmentary cross sectional elevation view illustrative of a novel memory cell structure of a dynamic random access memory, wherein said novel memory cell structure has a novel side wall contact structure in accordance with the present invention.

As a result, the structure illustrated in FIG. 3 is formed, wherein the over-lap margin 17 is formed between the top portion of the side wall contact 12-*b* and the fourth inter-layer insulator 8. This side wall contact structure causes the above effects and advantages of the present invention.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming a semiconductor device, comprising the steps, in the stated order, of:

forming a first oxide film (8) over a top surface of an inter-layer insulator (7);

forming a first nitride film (9) over a top surface of said first oxide film (8), wherein the first nitride film (9) is different in etching selectivity from said inter-layer insulator (7);

forming at least a contact hole (11) which penetrates said first nitride film (9), said first oxide film (8) and said inter-layer insulator (7);

depositing a second oxide film (12-*a*) on an upper surface of said first nitride film (9) and on side walls and a bottom of said at least a contact hole (11);

carrying out an etch-back process by use of said first nitride film (9) as an etching stopper for selectively etching said second oxide film (12-*a*) over said first nitride film (9) and on the bottom of said at least a contact hole (11) to form side wall oxide insulators (12-*b*) on the side walls of said at least a contact hole (11), wherein said etch back process is discontinued just when a top level of said side wall oxide insulators (12-*b*) lie lower than a top surface of said first oxide film (8) and higher than a bottom surface of said first oxide film (8);

removing said first nitride film (9);

filling said at least a contact hole (11) with a polysilicon film, so that said polysilicon film is completely isolated from said the inter-layer insulator (7) by said side wall oxide insulators (12-*b*) and said first oxide film (8);

patterning said polysilicon film to form a polysilicon storage electrode (13);

subjecting an exposed surface of said polysilicon storage electrode (13) to a wet etching to form an uneven surface defined by hemispherical grains of polysilicon of said polysilicon storage electrode (13);

forming a dielectric film (15) in contact with said uneven surface of said polysilicon storage electrode (13); and forming an opposite electrode (16) on said dielectric film (15) to form a storage capacitor.

2. The method as claimed in claim 1, wherein said first nitride film (9) comprises $Si_3N_4$.

3. The method as claimed in claim 1, wherein the inter-layer insulator (7) comprises a BPSG film.

4. The method as claimed in claim 3, further comprising a step of:

forming the BPSG film comprising said inter-layer insulator (7) from TEOS.

* * * * *